(12) United States Patent
Kanemaru et al.

(10) Patent No.: US 11,953,555 B2
(45) Date of Patent: Apr. 9, 2024

(54) ABNORMALITY DIAGNOSIS DEVICE, ABNORMALITY DIAGNOSIS METHOD, AND ABNORMALITY DIAGNOSIS SYSTEM

(71) Applicant: Mitsubishi Electric Corporation, Tokyo (JP)

(72) Inventors: Makoto Kanemaru, Tokyo (JP); Takuya Ohkubo, Tokyo (JP); Sota Sano, Tokyo (JP); Akira Satake, Tokyo (JP); Satoru Terashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1025 days.

(21) Appl. No.: 16/644,168

(22) PCT Filed: Oct. 24, 2017

(86) PCT No.: PCT/JP2017/038379
§ 371 (c)(1),
(2) Date: Mar. 4, 2020

(87) PCT Pub. No.: WO2019/082277
PCT Pub. Date: May 2, 2019

(65) Prior Publication Data
US 2020/0217895 A1 Jul. 9, 2020

(51) Int. Cl.
*G01R 31/34* (2020.01)
*H02H 7/08* (2006.01)
*H02P 29/024* (2016.01)

(52) U.S. Cl.
CPC ............ *G01R 31/343* (2013.01); *H02H 7/08* (2013.01); *H02P 29/027* (2013.01)

(58) Field of Classification Search
CPC ........ G01R 31/343; G01R 23/16; H02H 7/08; H02H 3/52; H02P 29/027; H02P 29/024; H02P 29/0241
See application file for complete search history.

(56) References Cited

U.S. PATENT DOCUMENTS

2006/0161391 A1* 7/2006 Inaba .................. G07C 5/0808
 702/183
2007/0005291 A1* 1/2007 Habetler ............. G05B 23/0254
 702/145
(Continued)

FOREIGN PATENT DOCUMENTS

JP H10-174373 A 6/1998
JP 2009-232606 A 10/2009
(Continued)

OTHER PUBLICATIONS

International Search Report and Written Opinion dated Jan. 16, 2018 for PCT/JP2017/038379 filed on Oct. 24, 2017, 8 pages including English Translation of the International Search Report.
(Continued)

*Primary Examiner* — Catherine T. Rastovski
*Assistant Examiner* — Lal C Mang
(74) *Attorney, Agent, or Firm* — XSENSUS LLP

(57) ABSTRACT

An abnormality diagnosis device includes: a data acquirer to acquire a current waveform and a driving frequency of an electric motor; a storage which stores a combination of a current value of the current waveform and the driving frequency at an identical time by the data acquirer; a data determiner to determine whether or not a current value of the current waveform and the driving frequency as a diagnosis target at an identical time by the data acquisition match the combination stored in the storage; an analyzer to perform frequency analysis for the current waveform determined to be matched by the data determiner, to extract sideband waves, and calculate a spectrum intensity of the sideband waves; and an abnormality diagnosis processor to make a diagnosis that abnormality has occurred, when the spectrum intensity of the sideband waves is equal to or greater than a threshold.

18 Claims, 10 Drawing Sheets

(56) References Cited

U.S. PATENT DOCUMENTS

| | | | | |
|---|---|---|---|---|
| 2011/0091226 A1* | 4/2011 | Ishigaya | ............... | G03G 21/02 |
| | | | | 399/33 |
| 2012/0262131 A1* | 10/2012 | Lee | ........................ | H02P 9/02 |
| | | | | 702/58 |
| 2017/0016960 A1* | 1/2017 | Rodriguez | ........... | G01R 31/343 |
| 2018/0059656 A1* | 3/2018 | Hiruta | ................. | G01R 31/343 |
| 2019/0003928 A1* | 1/2019 | Unuma | .............. | G01M 99/005 |

FOREIGN PATENT DOCUMENTS

| | | |
|---|---|---|
| JP | 2010-029003 A | 2/2010 |
| JP | 2010-288352 A | 12/2010 |
| JP | 2016-090546 A | 5/2016 |

OTHER PUBLICATIONS

Office Action dated Nov. 24, 2021, in corresponding Korean patent Application No. 10-2020-7010823, 10 pages.
Office Action dated Mar. 19, 2021, in corresponding Indian patent Application No. 202047014690, 5 pages.

* cited by examiner

FIG. 7

| i \ f | 51Hz | 52Hz | 53Hz | 54Hz | 55Hz | 56Hz | 57Hz | 58Hz | 59Hz | 60Hz | 61Hz |
|---|---|---|---|---|---|---|---|---|---|---|---|
| 1A | | | | | | | | | | | |
| 1.5A | | | | | | | | | | | |
| 2A | | 1 | | | | | | | | | |
| 2.5A | | 5 | | | | 1 | | | | | |
| 3A | | 20 | | | | 5 | | | | 1 | |
| 3.5A | | 60 | | | | 20 | | | | 5 | |
| 4A | | 100 | | | | 60 | | | | 20 | |
| 4.5A | | 40 | | | | 100 | | | | 60 | |
| 5A | | 20 | | | | 40 | | | | 100 | |
| 5.5A | | 5 | | | | 20 | | | | 40 | |
| 6A | | 1 | | | | 5 | | | | 20 | |
| 6.5A | | | | | | 1 | | | | 5 | |
| 7A | | | | | | | | | | 1 | |
| 7.5A | | | | | | | | | | | |

[//]: # (US 11,953,555 B2)

ABNORMALITY DIAGNOSIS DEVICE, ABNORMALITY DIAGNOSIS METHOD, AND ABNORMALITY DIAGNOSIS SYSTEM

CROSS-REFERENCE TO RELATED APPLICATION

The present application is based on PCT filing PCT/JP2017/038379, filed Oct. 24, 2017, the entire contents of which are incorporated herein by reference.

TECHNICAL FIELD

The present invention relates to abnormality diagnosis for an electric motor that is driven by a power conversion device.

BACKGROUND ART

An electric motor is a key component that serves as motive power for a production line apparatus or a mechanical apparatus in an industrial plant, and thus is required to constantly continue operation normally and stably. However, many of electric motors operate under highly stressful environments such as high temperature, high load, corrosion, and wear. Therefore, there is a high possibility that a sudden failure occurs. In order to avoid such a sudden failure, technology for constantly monitoring an electric motor is highly demanded. In recent years, as the constant monitoring technology, an abnormality diagnosis device that diagnoses abnormality of an electric motor by measuring current applied to the electric motor is being developed. For example, in Patent Document 1, current applied to an electric motor driven by a commercial power supply is measured and subjected to frequency analysis, and whether or not abnormality has occurred is diagnosed on the basis of the spectrum intensity of sideband waves due to abnormality, which arise at frequencies near the power supply frequency.

CITATION LIST

Patent Document

Patent Document 1: Japanese Laid-Open Patent Publication No. 2016-090546

SUMMARY OF THE INVENTION

Problems to be Solved by the Invention

However, in the case where an electric motor is driven by a power conversion device, when the current value and the driving frequency are changed, the spectrum intensity of sideband waves serving as an abnormality diagnosis criterion also changes. Therefore, whether change in the spectrum intensity of the sideband waves is due to the degree of abnormality or change in the current value and the driving frequency cannot be determined, and therefore it is difficult to diagnose whether or not abnormality has occurred.

The present invention has been made to solve the above problem, and an object of the present invention is to provide an abnormality diagnosis device, an abnormality diagnosis method, and an abnormality diagnosis system that are capable of diagnosing whether or not abnormality has occurred, even for an electric motor in which the current value and the driving frequency are changed due to the power conversion device.

Solution to the Problems

An abnormality diagnosis device according to the present invention includes: a data acquisition unit configured to acquire a current waveform and a driving frequency of an electric motor driven by a power conversion device; an operation pattern storage unit which stores a combination of a current value of the current waveform and the driving frequency that are acquired at an identical time by the data acquisition unit; a data determination unit configured to determine whether or not a current value of the current waveform and the driving frequency as a diagnosis target that are acquired at an identical time by the data acquisition unit match the combination stored in the operation pattern storage unit; an analysis unit configured to perform frequency analysis for the current waveform determined to be matched by the data determination unit, to extract sideband waves, and calculate a spectrum intensity of the sideband waves; and an abnormality diagnosis unit configured to make a diagnosis that abnormality has occurred, when the spectrum intensity of the sideband waves is equal to or greater than a threshold.

An abnormality diagnosis method according to the present invention includes: a data acquisition step of acquiring a current waveform and a driving frequency of an electric motor driven by a power conversion device; an operation pattern storage step of storing a combination of a current value of the current waveform and the driving frequency that are acquired at an identical time in the data acquisition step; a data determination step of determining whether or not a current value of the current waveform and the driving frequency as a diagnosis target that are acquired at an identical time in the data acquisition step match the combination stored in the operation pattern storage step; an analysis step of performing frequency analysis for the current waveform determined to be matched in the data determination step, to extract sideband waves, and calculate a spectrum intensity of the sideband waves; and an abnormality diagnosis step of making a diagnosis that abnormality has occurred, when the spectrum intensity of the sideband waves is equal to or greater than a threshold.

An abnormality diagnosis system according to the present invention includes: the power conversion device configured to read the current waveform and the driving frequency of the electric motor; an abnormality diagnosis device configured to acquire the current waveform and the driving frequency read by the power conversion device, determine whether or not a current value of the current waveform and the driving frequency match the combination stored in the operation pattern storage unit, and diagnose whether or not abnormality has occurred on the basis of the current waveform determined to be matched; and a monitoring device configured to output at least one of an indication and an alarm on the basis of a result of diagnosis by the abnormality diagnosis device.

Effect of the Invention

According to the present invention, a combination of the current value of a current waveform and a driving frequency that are acquired at an identical time is specified, and a current waveform matching the specified combination of the current value and the driving frequency is subjected to abnormality diagnosis. Thus, it becomes possible to detect abnormality even for an electric motor in which the current value and the driving frequency are changed due to the power conversion device.

BRIEF DESCRIPTION OF THE DRAWINGS

FIG. 7 is a diagram for explaining the abnormality diagnosis device according to embodiment 1 of the present invention.

DESCRIPTION OF EMBODIMENTS

Hereinafter, embodiments according to the present invention will be described with reference to the drawings.

Figure 1:
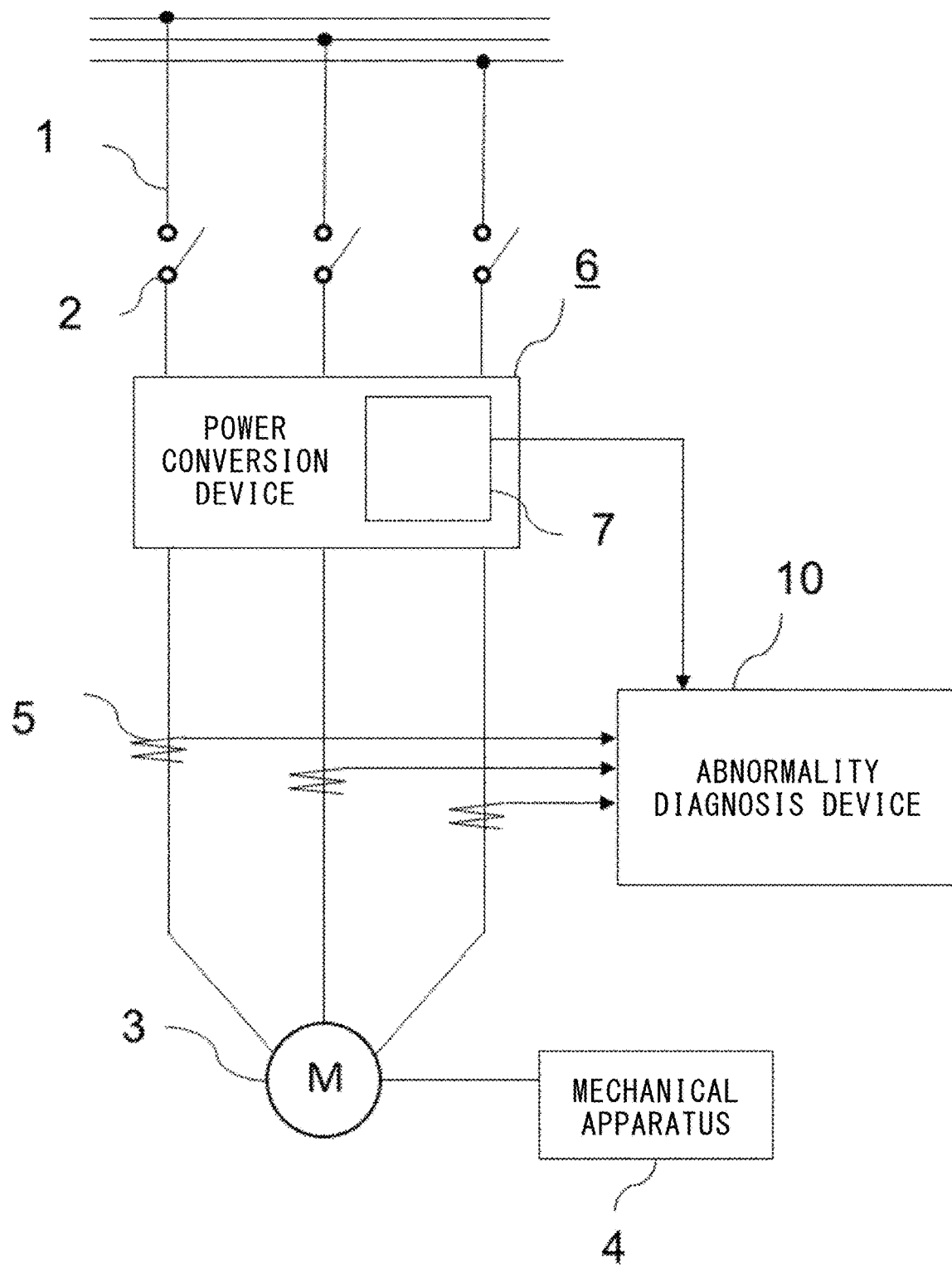
FIG. 1 is a schematic configuration diagram showing an abnormality diagnosis device according to embodiment 1 of the present invention.

FIG. 1 is a schematic configuration diagram showing the installation condition of an abnormality diagnosis device according to the present invention. As shown in FIG. 1, a plurality of wiring circuit breakers 2, a power conversion device 6, an abnormality diagnosis device 10, and an electric motor 3 are connected to power supply lines 1. The electric motor 3 is driven by the power conversion device 6, and is connected to a mechanical apparatus 4 as a load via a motive power transfer mechanism for transferring motive power. A current detection unit 5 is provided to lines connecting the power conversion device 6 and the electric motor 3, and detects current applied to the electric motor 3. A driving frequency detection unit 7 is provided to the power conversion device 6 and detects the driving frequency of the electric motor 3 on the basis of a command signal generated in the power conversion device 6. The abnormality diagnosis device 10 diagnoses whether or not abnormality has occurred in the electric motor 3, on the basis of current detected by the current detection unit 5 and the driving frequency detected by the driving frequency detection unit 7. Here, examples of abnormality of the electric motor 3 include abnormality of a bearing, axis eccentricity, misalignment, and imbalance.

Here, the current detection unit 5 shown in FIG. 1 is provided for each phase of the three-phase power supply lines. However, measurement may be performed for any of the phases. In addition, since detection accuracy is hardly influenced by the measurement location, the location where the current detection unit 5 is provided is not limited as long as current applied to the electric motor 3 can be measured. Abnormality diagnosis may be performed for a plurality of electric motors 3 by one abnormality diagnosis device 10. Instead of the current detection unit 5, a sensor provided in the power conversion device 6 may be used.

Figure 2:
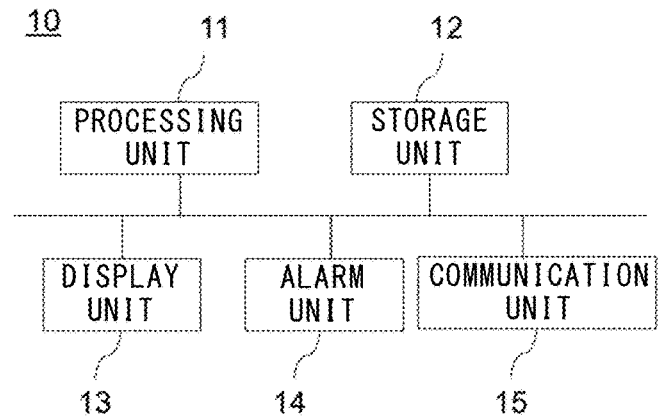
FIG. 2 is a schematic configuration diagram showing the abnormality diagnosis device according to embodiment 1 of the present invention.

Next, the configuration of the abnormality diagnosis device 10 will be described with reference to FIG. 2. FIG. 2 is a schematic configuration diagram of the abnormality diagnosis device. The abnormality diagnosis device 10 includes, for example, a processing unit 11, a storage unit 12, a display unit 13, an alarm unit 14, and a communication unit 15. The processing unit 11 executes a predetermined process on the basis of various data stored in the storage unit 12. When the electric motor 3 is diagnosed as abnormal, the display unit 13 and the alarm unit 14 receive signals and output a display indication and an alarm to notify an observer of the abnormality. Here, only one of the display unit 13 and the alarm unit 14 may be used to provide the above functions. The abnormality diagnosis device 10 is formed by a server, a personal computer (PC), a microcomputer, etc., connected to a network, for example.

Figure 3:
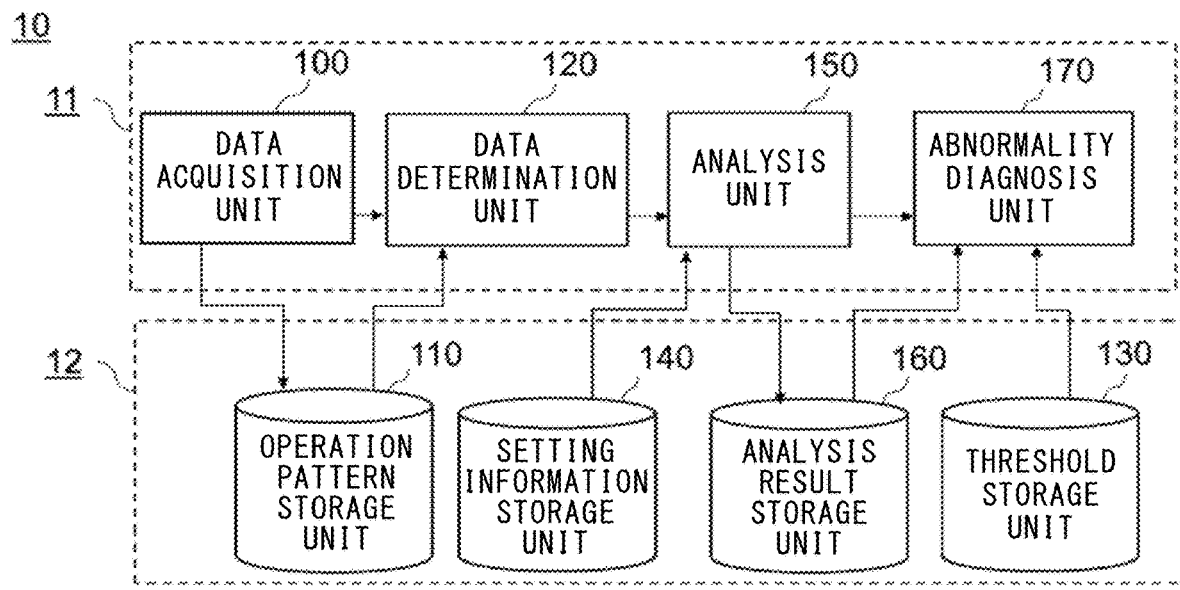
FIG. 3 is a schematic configuration diagram showing the abnormality diagnosis device according to embodiment 1 of the present invention.

Next, a configuration for implementing the functions of the abnormality diagnosis device 10 will be described with reference to FIG. 3. FIG. 3 is a schematic configuration diagram of the abnormality diagnosis device. The abnormality diagnosis device 10 includes a data acquisition unit 100, a data determination unit 120, an analysis unit 150, and an abnormality diagnosis unit 170 in the processing unit 11, and includes an operation pattern storage unit 110, a threshold storage unit 130, a setting information storage unit 140, and an analysis result storage unit 160 in the storage unit 12. Here, in the case where necessary information is not stored in the storage unit 12, the abnormality diagnosis device 10 may be further provided with an input unit so that the necessary information is inputted.

In the abnormality diagnosis device 10, the data acquisition unit 100 acquires a driving frequency and a current waveform of current applied to the electric motor 3. Then, the data determination unit 120 determines whether or not a combination of the effective value of the current waveform and the driving frequency acquired at an identical time matches a combination stored in the operation pattern storage unit 110. The analysis unit 150 performs frequency analysis for the current waveform determined to be matched by the data determination unit 120, calculates the spectrum intensity of sideband waves due to abnormality on the basis of the setting information stored in the setting information storage unit 140, and stores the spectrum intensity in the analysis result storage unit 160. If the calculated spectrum intensity of the sideband waves is equal to or greater than the threshold stored in the threshold storage unit 130, the abnormality diagnosis unit 170 makes a diagnosis that abnormality has occurred.

Figure 4:
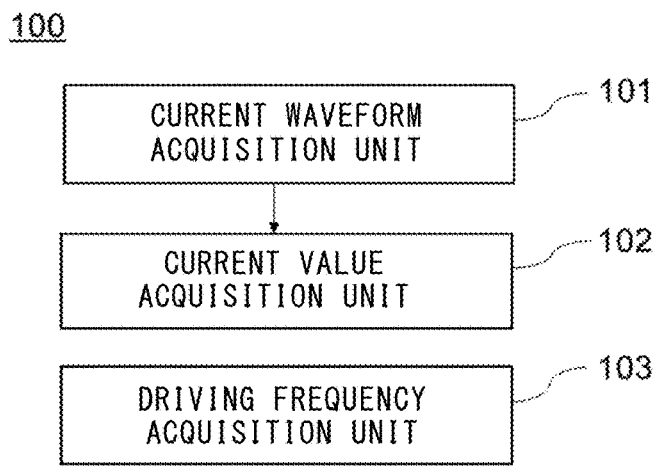
FIG. 4 is a schematic configuration diagram showing a data acquisition unit according to embodiment 1 of the present invention.

FIG. 4 is a schematic configuration diagram showing the data acquisition unit. The data acquisition unit 100 includes a current waveform acquisition unit 101, a current value acquisition unit 102, and a driving frequency acquisition unit 103. The current waveform acquisition unit 101 acquires a current waveform from current detected by the current detection unit 5. The current value acquisition unit 102 calculates and acquires the effective value (hereinafter, referred to as current value) from the current waveform acquired by the current waveform acquisition unit 101. The current value is calculated as a square root of a value obtained by averaging the square of the instantaneous value of the current waveform over one cycle, for example. The driving frequency acquisition unit 103 acquires the driving frequency detected by the driving frequency detection unit 7 of the power conversion device 6. As the driving frequency, the position of the spectrum peak having the greatest intensity in frequency analysis performed by the analysis unit 150 on the current waveform acquired by the current waveform acquisition unit 101, may be used.

The operation pattern storage unit 110 acquires the current value and the driving frequency from the data acquisition unit 100, and stores a combination of the current value and the driving frequency acquired at an identical time for a large number of times. Hereinafter, a stage in which the current waveform and the driving frequency are detected in order to specify such a combination to be stored in the operation pattern storage unit 110 is referred to as learning stage 503. In addition, a stage in which the current waveform and the driving frequency are detected in order to perform abnormality diagnosis is referred to as diagnosis stage 504. Here, it is preferable that the electric motor 3 is operating normally in the learning stage 503.

Figure 5:
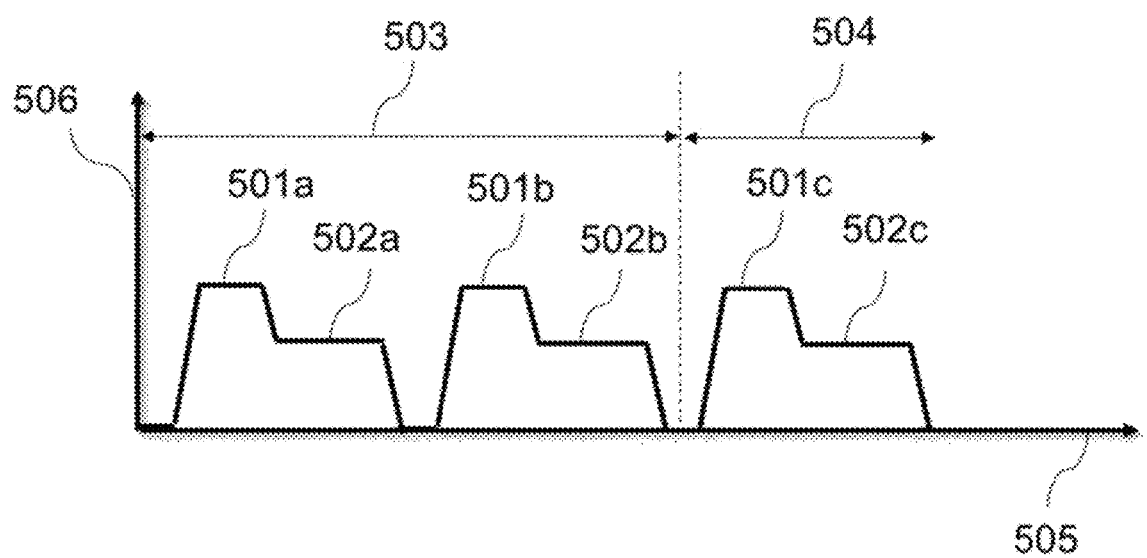
FIG. 5 is a relationship graph showing an example of an operation pattern of an electric motor according to embodiment 1 of the present invention.

FIG. 5 is a relationship graph showing an example of an operation pattern of the electric motor. A vertical axis 506 indicates the current value or the driving frequency, a horizontal axis 505 indicates time, and the operation pattern of the electric motor 3 in the learning stage 503 and the diagnosis stage 504 is shown. Here, the operation pattern is a pattern of the current value or the driving frequency, issued by the power conversion device 6 and repeated at predetermined time intervals.

In the example shown in FIG. 5, a first waveform 501a and a second waveform 501b in the learning stage 503 and a third waveform 501c in the diagnosis stage 504 have identical current values or driving frequencies. Thus, the electric motor 3 has the same operation pattern in the learning stage 503 and the diagnosis stage 504. Here, the identical current values or driving frequencies include a measurement error. For example, they can be regarded as identical if the error is about ±0.01 to 0.1 A or ±0.01 to 0.1 Hz.

Figure 6:
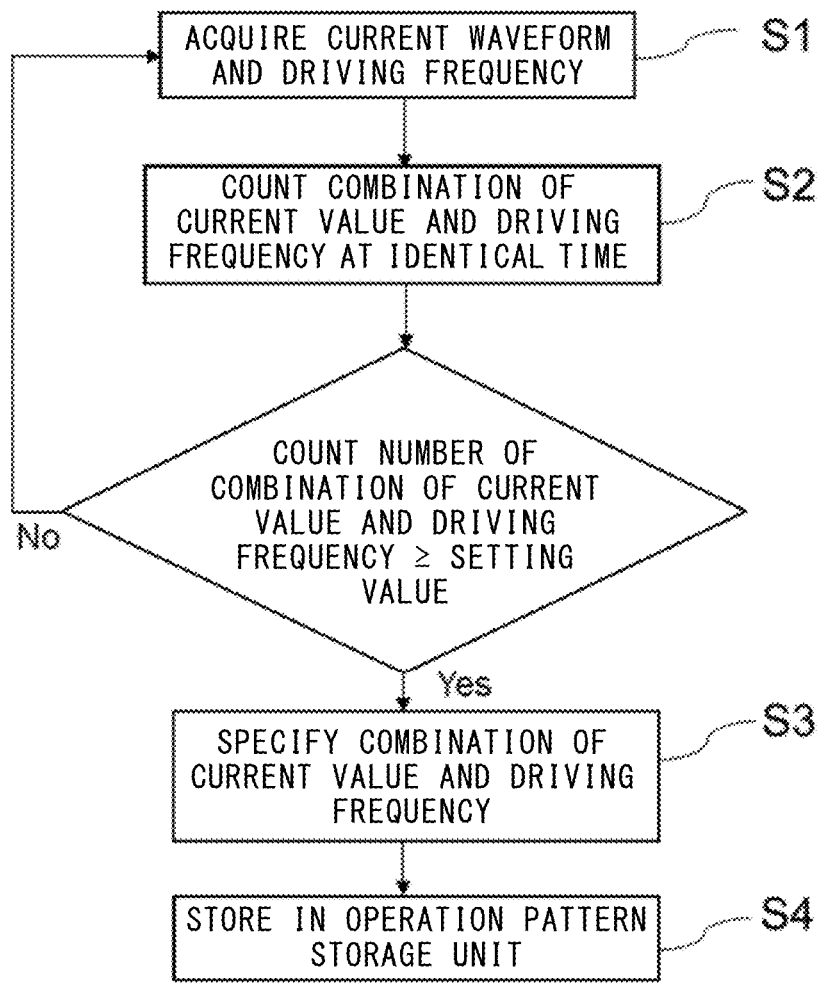
FIG. 6 shows the processing procedure of the abnormality diagnosis device according to embodiment 1 of the present invention.

Next, the processing procedure for storing a combination of the current value and the driving frequency in the operation pattern storage unit 110 in the learning stage 503 will be described with reference to FIG. 6. FIG. 6 shows an example of the processing procedure of the abnormality diagnosis device in the learning stage. First, the data acquisition unit 100 acquires the current waveform and the driving frequency at predetermined time intervals from the current detection unit 5 and the driving frequency detection unit 7, respectively (step S1). The data acquisition unit 100 calculates the current value from the current waveform, and sets the current value of the current waveform and the driving frequency acquired at an identical time, as one combination.

Next, among combinations of the current values and the driving frequencies acquired at identical times, the number of times an identical combination is acquired is counted (step S2). As the counting method, for example, as shown in FIG. 7, in the operation pattern storage unit 110 which stores current values and driving frequencies in a map form, each combination of the current value and the driving frequency acquired at an identical time is stored, whereby the number of times an identical combination is acquired can be counted. In the example shown in FIG. 7, as a combination of the current value and the driving frequency acquired at an identical time (i: current value, f: driving frequency), combinations of 4 A and 52 Hz, 4.5 A and 56 Hz, and 5 A and 60 Hz are each counted 100 times, which is the largest number of times. Then, combinations of 3.5 A and 52 Hz, 4 A and 56 Hz, and 4.5 A and 60 Hz are each counted 60 times, which is the next largest number of times.

Next, for example, the counted number of times is compared with a predetermined setting value, and a combination of the current value and the driving frequency for which the counted number of times is equal to or greater than the setting value is specified (step S3). In the case where the setting value is 80, combinations of current values and driving frequencies of 4 A and 52 Hz, 4.5 A and 56 Hz, and 5 A and 60 Hz are specified. The specified combinations of current values and driving frequencies for which the counted number of times is equal to or greater than the setting value are stored into the operation pattern storage unit 110 (step S4). As described above, the operation pattern storage unit 110 stores combinations acquired a large number of times, as the combination of the current value of the current waveform and the driving frequency to be used for abnormal diagnosis.

The data determination unit 120 acquires a combination of the current value of the current waveform and the driving frequency as a diagnosis target that are acquired at an identical time, from the data acquisition unit 100, and checks the acquired combination of the current value and the driving frequency against the combination of the current value and the driving frequency stored in the operation pattern storage unit 110, to determine whether or not they are matched. The current waveform determined to be matched is outputted to the analysis unit 150, so as to be subjected to abnormality diagnosis.

The threshold storage unit 130 stores a threshold for the spectrum intensity of sideband waves, as a diagnosis criterion for abnormality. Generally, the greater the degree of abnormality is, the greater the spectrum intensity of sideband waves is, and the spectrum intensity of sideband waves depends on the driving frequency and the current value of the electric motor 3. As the threshold, values associated with respective combinations of current values and driving frequencies stored in the operation pattern storage unit 110 are set. For example, the threshold is determined as follows. In a normal state of the electric motor 3, the data acquisition unit 100 acquires the current waveform and the driving frequency, the current waveform determined to match the combination of the current value and the driving frequency stored in the operation pattern storage unit 110 by the data determination unit 120 is subjected to frequency analysis, and the spectrum intensity of sideband waves is calculated. Then, on the basis of the calculation result, the threshold is determined. Here, since the data has a distribution due to error, for example, a standard deviation σ of spectrum intensities of sideband waves is calculated, and the range in which data within 3σ are present is used as the threshold.

As described above, in the learning stage 503, combinations of current values and driving frequencies to be used for abnormality diagnosis are stored in the operation pattern storage unit 110, and in the diagnosis stage 504, the current waveform determined to match the combination stored in the operation pattern storage unit 110 is subjected to abnormality diagnosis. Thus, abnormality diagnosis can be performed using the threshold corresponding to the combination of the current value and the driving frequency, and therefore, even in the case of the electric motor 3 in which the spectrum intensity of sideband waves serving as a diagnosis criterion is changed due to change in the current value and the driving frequency by the power conversion device 6, it is possible to detect abnormality. Further, the current waveform to be subjected to abnormality diagnosis is the current waveform corresponding to the combination of the current value and the driving frequency acquired for a large number of times. Therefore, the number of samples of the current waveform to be subjected to diagnosis can be increased, whereby abnormality detection accuracy can be enhanced.

Figure 8:
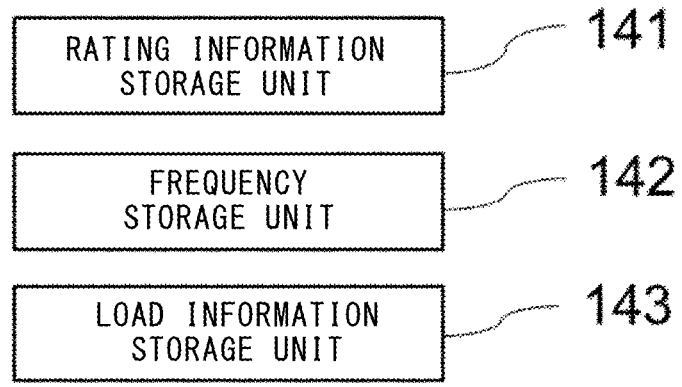
FIG. 8 is a schematic configuration diagram of a setting information storage unit according to embodiment 1 of the present invention.

FIG. 8 is a schematic configuration diagram of the setting information storage unit. The setting information storage unit 140 includes a rating information storage unit 141, a frequency storage unit 142, and a load information storage unit 143. The setting information storage unit 140 stores information needed for specifying the frequencies at which sideband waves arise.

In the rating information storage unit 141, rating information such as the power supply frequency, the number of poles, and the rated rotation speed is stored on the basis of information of a rating plate attached to the electric motor 3.

Figure 9:
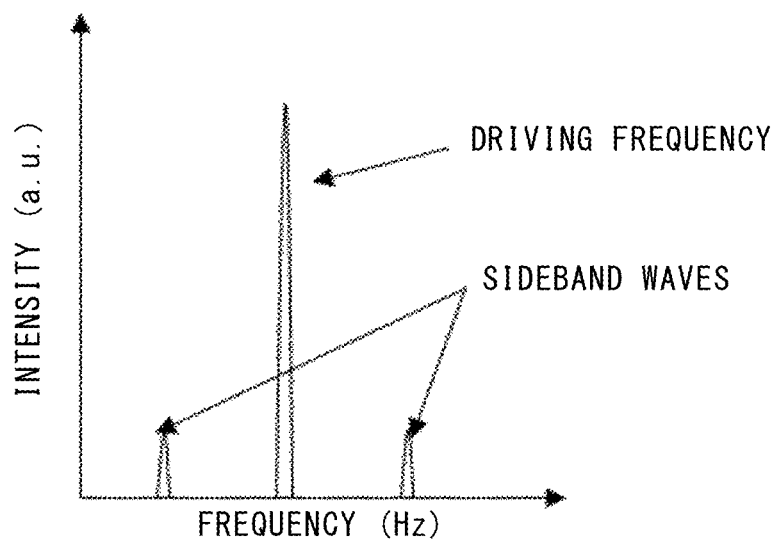
FIG. 9 is a relationship graph showing an example of a frequency spectrum waveform according to embodiment 1 of the present invention.

The frequency storage unit 142 includes a rotation frequency storage unit 142a and a bearing natural frequency storage unit 142b. The frequency storage unit 142 stores the rotation frequency of the electric motor 3 and the bearing natural frequency. As shown in FIG. 9, sideband waves arise on both sides near the driving frequency, at positions that differ depending on the type of abnormality. For example, in the case of abnormality such as misalignment or imbalance, sideband waves arise at positions separated by the rotation frequency toward both sides from the driving frequency as the center. In addition, in the case of abnormality due to the bearing of the electric motor 3, sideband waves arise at positions separated by the bearing natural frequency toward both sides from the driving frequency as the center.

The rotation frequency storage unit 142a stores the rotation frequency of the electric motor 3. The rotation frequency of the electric motor 3 is in a range between the rotation frequency in the case of no load and the rotation frequency in the case of rated rotation, for example. The rotation frequency in the case of no load is calculated as 2·fs/p (fs: power supply frequency, p: number of poles) from the power supply frequency and the number of poles stored in the rating information storage unit 141. In addition, the rotation frequency in the case of rated rotation is calculated from the rated rotation speed stored in the rating information storage unit 141. The bearing natural frequency storage unit 142b stores the bearing natural frequency on the basis of the bearing information.

The load information storage unit 143 stores load information. The load information is, for example, the type of apparatus such as a pump, a fan, or a compressor, presence/absence of a belt or a chain, and the like. The rotation frequency changes depending on the load on the electric motor 3. For example, in the case where a belt or a chain is provided, an external load is applied to the shaft of the electric motor 3, and therefore the rotation frequency tends to be great. By storing the load information in the load information storage unit 143, it becomes possible to correct the rotation frequency stored in the rotation frequency storage unit 142a.

Figure 10:
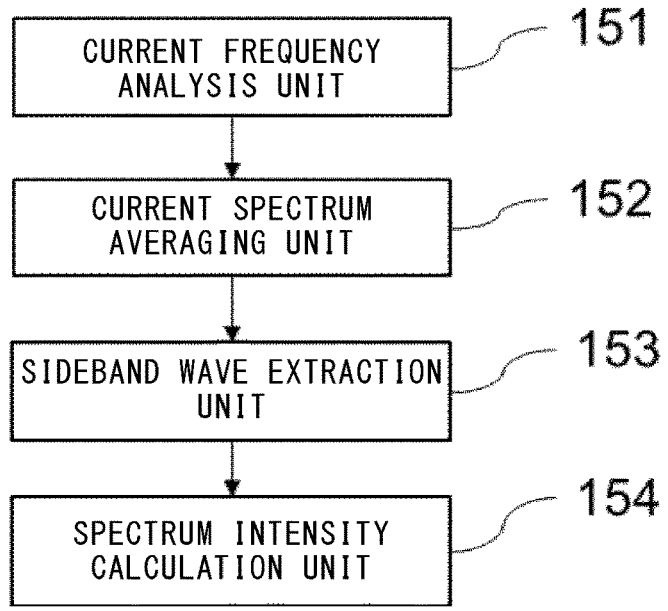
FIG. 10 is a schematic configuration diagram showing an analysis unit according to embodiment 1 of the present invention.

Next, the analysis unit 150 will be described with reference to FIG. 10. FIG. 10 is a schematic configuration diagram of the analysis unit. The analysis unit 150 includes a current frequency analysis unit 151, a current spectrum averaging unit 152, a sideband wave extraction unit 153, and a spectrum intensity calculation unit 154.

The current frequency analysis unit 151 performs frequency analysis for the current waveform determined to match the combination of the current value and the driving frequency stored in the operation pattern storage unit 110 by the data determination unit 120. The current waveform is analyzed by, for example, current fast Fourier transform (FFT) analysis, discrete Fourier transform, or the like.

Figure 11:
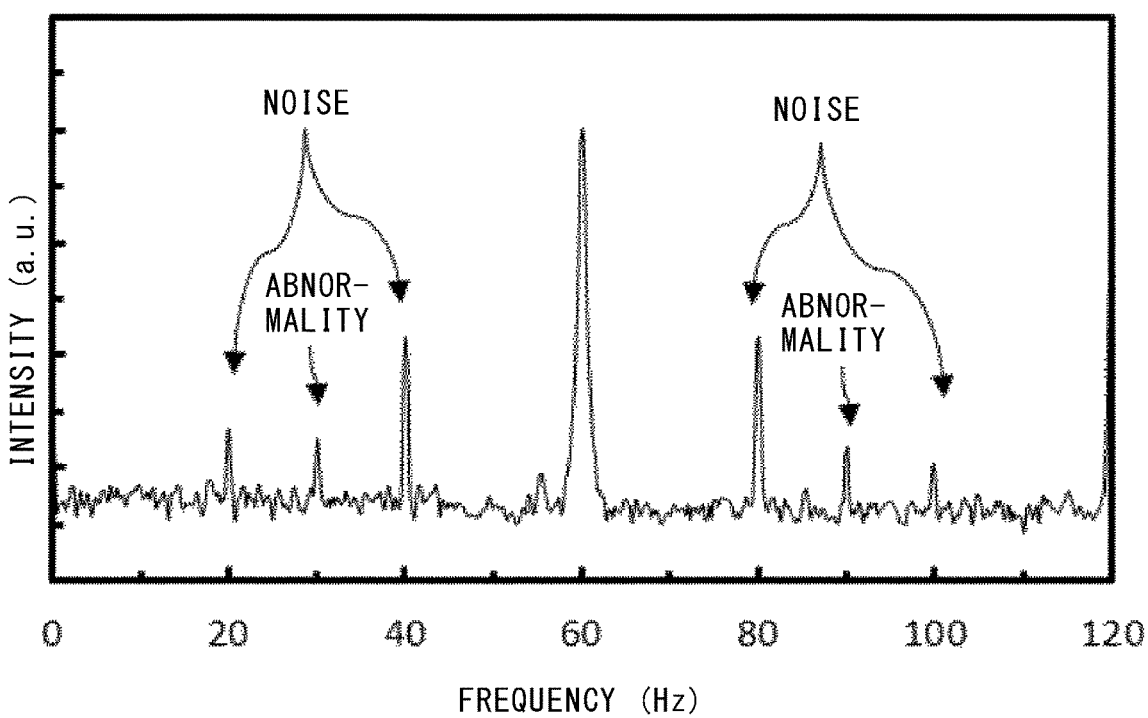
FIG. 11 is a relationship graph showing an example of a frequency spectrum waveform according to embodiment 1 of the present invention.

The current spectrum averaging unit 152 averages frequency spectrum waveforms obtained for a plurality of times from the current frequency analysis unit 151. As shown in FIG. 11, the frequency spectrum waveform includes noise due to switching operation of the power conversion device 6, in addition to a spectrum arising due to abnormality of the electric motor 3. Averaging the frequency spectrum waveforms can reduce the spectrum intensity of noise arising near the driving frequency and thus can improve detection accuracy for sideband waves due to abnormality.

The sideband wave extraction unit 153 detects all the positions of spectrum peaks from the frequency spectrum waveform obtained from the current frequency analysis unit 151. It is preferable that the detection range is 0 to 1000 Hz. The sideband wave extraction unit 153 extracts, as sideband waves, spectrum peaks arising at positions separated by equal frequencies toward both sides from the driving frequency as the center. At this time, the driving frequency to be used may be the driving frequency obtained by the data acquisition unit 100 at the same time as the current waveform, or may be calculated from the position of the spectrum peak that has the greatest intensity among the detected spectrum peaks.

The spectrum intensity calculation unit 154 includes a rotation frequency calculation unit 154a and a bearing natural frequency calculation unit 154b each of which calculates the spectrum intensity of sideband waves. The rotation frequency calculation unit 154a acquires the rotation frequency stored in the rotation frequency storage unit 142a, and extracts positions separated by the rotation frequency from the driving frequency. Then, the rotation frequency calculation unit 154a calculates the spectrum intensities of spectrum peaks arising at the extracted positions. Similarly, the bearing natural frequency calculation unit 154b acquires the bearing natural frequency stored in the bearing natural frequency storage unit 142b, and extracts positions separated by the bearing natural frequency from the driving frequency. Then, the bearing natural frequency calculation unit 154b calculates the spectrum intensities of spectrum peaks arising at the extracted positions. These calculated spectrum intensities are stored into the analysis result storage unit 160, together with the current value and the driving frequency at the time when the current waveform has been acquired.

Here, the calculation of the spectrum intensity of sideband waves may be performed in at least one of the rotation frequency calculation unit 154a and the bearing natural frequency calculation unit 154b, and an input unit may be provided to the abnormality diagnosis device 10 so that either of the calculation units can be selected in accordance with the type of abnormality to be diagnosed.

As described above, in the learning stage 503, combinations of current values and driving frequencies are stored in the operation pattern storage unit 110, and in the diagnosis stage 504, the current waveform matching the stored combination is subjected to frequency analysis. Thus, even in the case where the positions of sideband waves are changed due to change in the driving frequency by the power conversion device 6, the positions of the sideband waves can be accurately extracted.

The abnormality diagnosis unit 170 acquires the threshold corresponding to the driving frequency and the current value of the analyzed current waveform, from the threshold storage unit 130, and makes a diagnosis that abnormality has occurred if the calculated spectrum intensity of sideband waves is equal to or greater than the threshold.

As described above, the abnormality diagnosis device 10 according to the present embodiment is configured to, in the learning stage 503, store combinations of current values and driving frequencies to be used for abnormality diagnosis into the operation pattern storage unit 110, and in the diagnosis stage 504, perform frequency analysis for the current waveform that matches the combination stored in the operation pattern storage unit 110, and diagnose whether or not abnormality has occurred on the basis of the calculated spectrum intensity of sideband waves. With this configuration, the spectrum intensity of sideband waves is compared with the threshold corresponding to the combination of the driving frequency and the current value of the analyzed current waveform, whereby whether or not abnormality has occurred can be diagnosed. Thus, even in the case where the current value and the driving frequency are changed due to the power conversion device 6 and the spectrum intensity of sideband waves serving as an abnormality diagnosis criterion is changed, abnormality can be detected.

Figure 12:
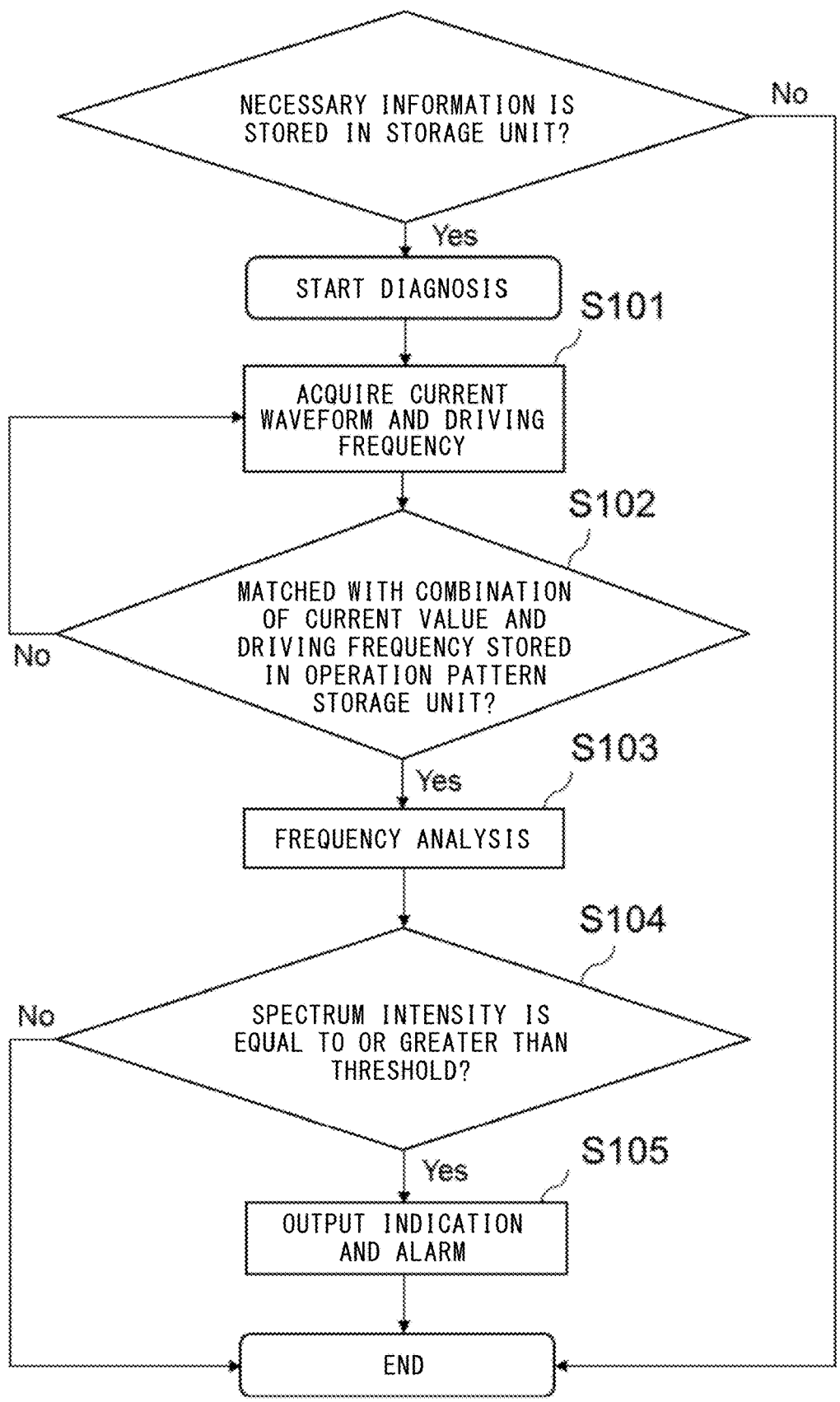
FIG. 12 shows the processing procedure in the abnormality diagnosis device according to embodiment 1 of the present invention.

Next, with reference to FIG. 12, operation in the diagnosis stage 504 in which the abnormality diagnosis device 10 performs abnormality diagnosis will be described. FIG. 12 shows an example of the processing procedure in the abnormality diagnosis device. The abnormality diagnosis device 10 starts abnormality diagnosis if, through the learning stage 503, the current value of the current waveform and the driving frequency to be used for diagnosis have been stored in the operation pattern storage unit 110 and necessary information has been stored also in the threshold storage unit 130 and the setting information storage unit 140 (YES).

First, in step S101, the data acquisition unit 100 acquires the current waveform and the driving frequency as a diagnosis target at predetermined time intervals, and calculates and acquires the current value from the current waveform. In step S102, the data determination unit 120 determines whether or not the combination of the current value of the current waveform and the driving frequency acquired at an identical time matches the combination of the current value and the driving frequency stored in the operation pattern storage unit 110, and if they are matched (YES), the data determination unit 120 outputs the current waveform at this time to the analysis unit 150.

In step S103, the current waveform determined to be matched is subjected to frequency analysis by the analysis unit 150. The analysis unit 150 extracts positions at which sideband waves arise from the driving frequency, and calculates the spectrum intensity of the sideband waves. In step S104, the abnormality diagnosis unit 170 compares the calculated spectrum intensity of the sideband waves with the threshold corresponding to the driving frequency and the current value of the analyzed current waveform, and if the calculated spectrum intensity is equal to or greater than the threshold (YES), the abnormality diagnosis unit 170 makes a diagnosis that abnormality has occurred. In step 105, if abnormality is indicated by the diagnosis, the display unit 13 and the alarm unit 14 output an indication and an alarm accordingly. At this time, at least one of operations of the display unit 13 and the alarm unit 14 may be performed.

Here, operation in the learning stage 503 may be always performed before the diagnosis stage 504, or if the operation pattern has been established, diagnosis may be performed on the basis of combinations of current values and driving frequencies stored in the operation pattern storage unit 110 in advance, without performing operation in the learning stage 503.

As described above, whether or not abnormality has occurred is diagnosed on the basis of the current waveform corresponding to the combination of the current value and the driving frequency stored in the operation pattern storage unit 110 in the learning stage 503, whereby it becomes possible to detect abnormality even for the electric motor 3 driven by the power conversion device 6.

Embodiment 2

In embodiment 2, the current waveform acquired from the data acquisition unit 100 in embodiment 1 is subjected to coordinate conversion, and frequency analysis is performed on d-axis current and q-axis current in a dq-axis coordinate system.

Figure 13:
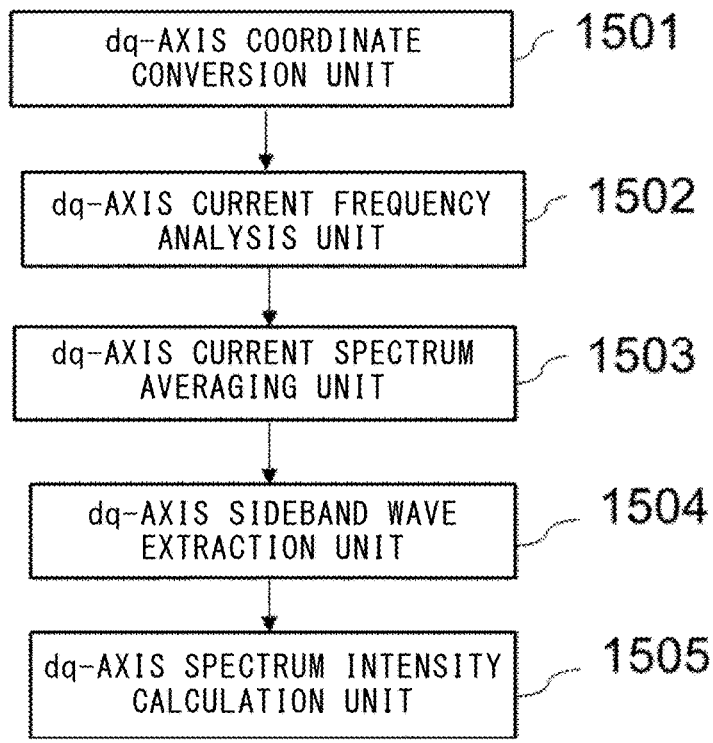
FIG. 13 is a schematic configuration diagram showing a dq-axis analysis unit according to embodiment 2 of the present invention.
Figure 14:
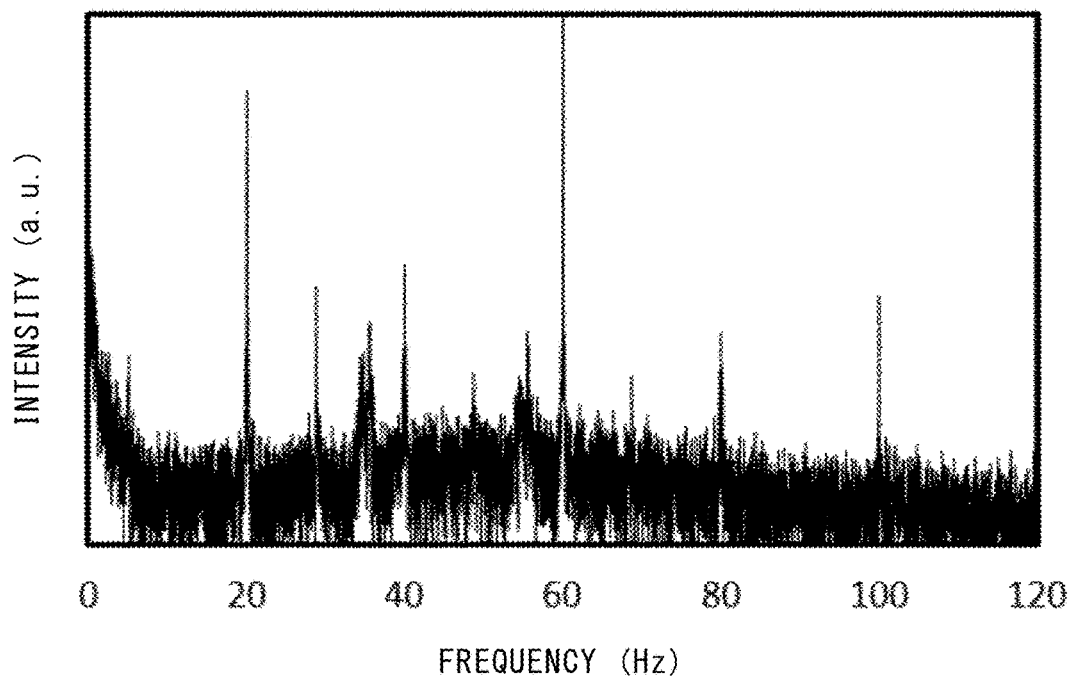
FIG. 14 is a relationship graph showing an example of a q-axis frequency spectrum waveform according to embodiment 2 of the present invention.

FIG. 13 is a schematic configuration diagram of a dq-axis analysis unit. A dq-axis analysis unit 1500 includes a dq-axis coordinate conversion unit 1501, a dq-axis current frequency analysis unit 1502, a dq-axis current spectrum averaging unit 1503, a dq-axis sideband wave extraction unit 1504, and a dq-axis spectrum intensity calculation unit 1505. Here, the d axis indicates the direction of a magnetic flux of the electric motor 3, and the q axis indicates a direction perpendicular to the d axis. The d-axis current is current corresponding to the magnetic flux, and the q-axis current is current corresponding to torque. FIG. 14 shows a q-axis frequency spectrum waveform of the electric motor. The vertical axis indicates the spectrum intensity and the horizontal axis indicates the frequency. As shown in FIG. 14, sideband waves serving as a diagnosis criterion for presence/absence of abnormality are extracted also in the frequency spectrum waveform of the current waveform that has undergone the dq-axis coordinate conversion.

Also in such a configuration, as in embodiment 1, it is possible to perform abnormality diagnosis for the electric motor 3 in which the current value and the driving frequency are changed due to the power conversion device 6. Further, the current waveform acquired by the data acquisition unit 100 is subjected to dq-axis conversion, whereby it becomes possible to accurately perform detection for abnormality due to air gap variation such as eccentricity on the basis of the d-axis current, and detection for abnormality due to load pulsation on the basis of the q-axis current.

In the present embodiment, coordinate conversion to d-axis current and q-axis current in a dq-axis coordinate system is performed. However, conversion to a-axis current and β-axis current in an αβ-axis coordinate system may be performed to perform frequency analysis.

Embodiment 3

Figure 15:
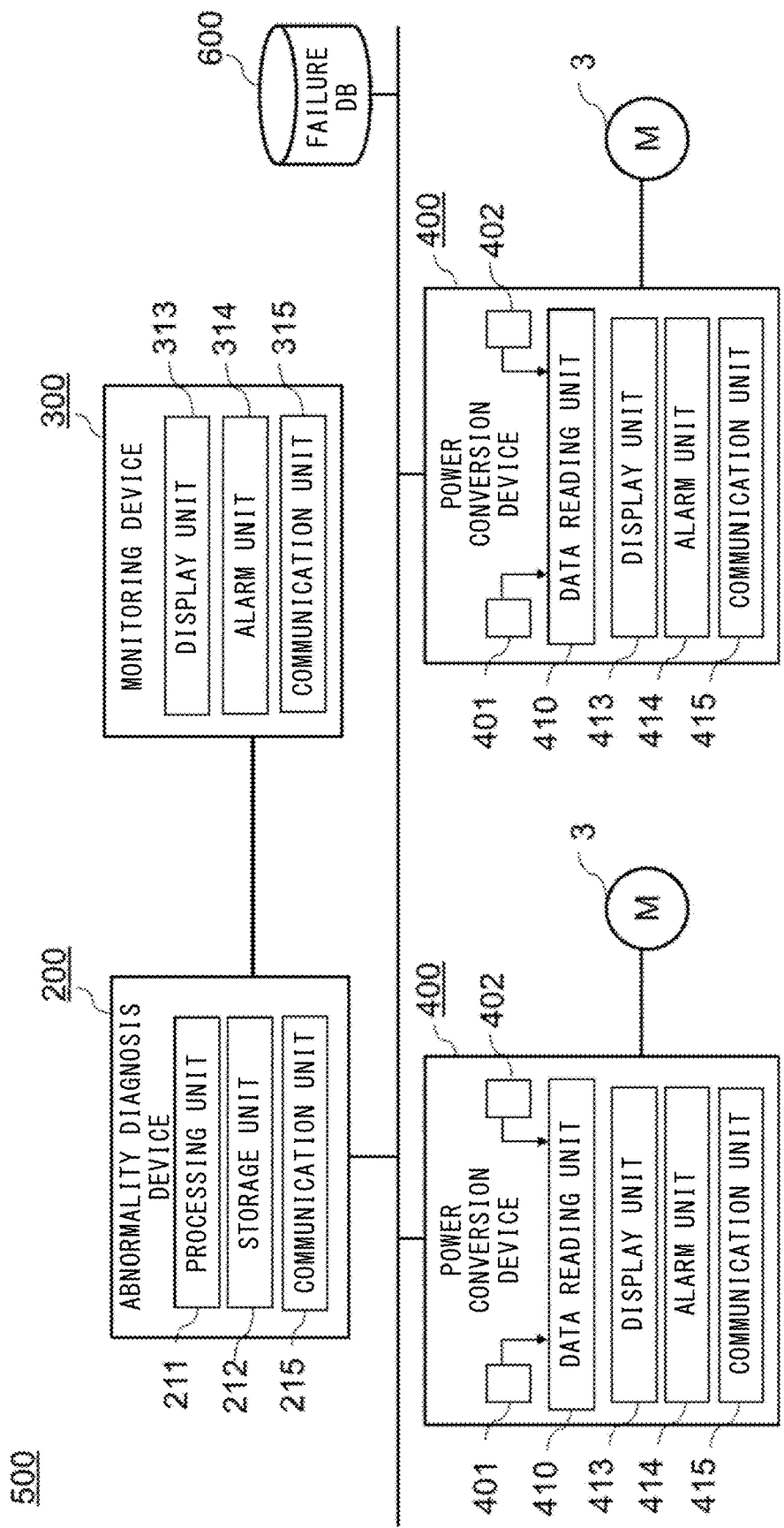
FIG. 15 is a schematic configuration diagram showing an abnormality diagnosis system according to embodiment 3 of the present invention.

An abnormality diagnosis system according to embodiment 3 for carrying out the present invention will be described with reference to FIG. 15. FIG. 15 is a schematic configuration diagram showing an example of the abnormality diagnosis system. In the present embodiment, the same reference characters as those in embodiment 1 denote the same or corresponding parts. An abnormality diagnosis system 500 includes an abnormality diagnosis device 200, a monitoring device 300, and power conversion devices 400.

Embodiment 1 has shown an example in which the abnormality diagnosis device 10 connected to the electric motor 3 acquires data and performs processing on the data, and if abnormality is indicated by the diagnosis, an indication and an alarm are outputted accordingly. On the other hand, in the present embodiment, each of the power conversion devices 400 connected to electric motors 3 reads data, the abnormality diagnosis device 200 acquires the read data and diagnoses whether or not abnormality has occurred, and then, on the basis of a result of the diagnosis, the monitoring device 300 outputs an indication and an alarm.

The power conversion device 400 includes a current detection unit 401, a driving frequency detection unit 402, a data reading unit 410, a display unit 413, an alarm unit 414, and a communication unit 415. The power conversion device 400 drives the electric motor 3. The power conversion device 400 reads, by the data reading unit 410, the current waveform and the driving frequency from the current detection unit 401 and the driving frequency detection unit 402. The current detection unit 401 is a current sensor provided in the power conversion device 400. The current waveform and the driving frequency read by the data reading unit 410 are transmitted to a communication unit 215 of the abnormality diagnosis device 200 via the communication unit 415.

The abnormality diagnosis device 200 includes a processing unit 211, a storage unit 212, and the communication unit 215. The abnormality diagnosis device 200 acquires the current waveform and the driving frequency, using the communication unit 215 as the data acquisition unit 100. The abnormality diagnosis device 200 includes the data determination unit 120, the analysis unit 150, and the abnormality diagnosis unit 170 in the processing unit 211, and includes the operation pattern storage unit 110, the threshold storage unit 130, the setting information storage unit 140, and the analysis result storage unit 160 in the storage unit 212.

The current waveform and the driving frequency transmitted from the power conversion device 400 are acquired by the communication unit 215 serving as the data acquisition unit 100. The data determination unit 120 determines whether or not the current value of the current waveform and the driving frequency acquired matches the combination stored in the operation pattern storage unit 110. The analysis unit 150 performs frequency analysis for the current waveform determined to be matched, to calculate the spectrum intensity of sideband waves. The abnormality diagnosis unit 170 compares the calculated spectrum intensity of sideband waves with the threshold, to diagnose whether or not abnormality has occurred. The obtained diagnosis result is transmitted from the communication unit 215 of the abnormality diagnosis device 200 to a communication unit 315 of the monitoring device 300 and the communication unit 415 of the power conversion device 400.

The monitoring device 300 includes a display unit 313, an alarm unit 314, and the communication unit 315. The monitoring device 300 is provided at a place where an observer is present, and outputs an indication and an alarm by the display unit 313 and the alarm unit 314 in accordance with the diagnosis result. The diagnosis result is also transmitted to the power conversion device 400, and if abnormality is indicated by the diagnosis, the display unit 413 and the alarm unit 414 output an indication and an alarm. At least either of the display units 313, 413 and the alarm units 314, 414 may perform such indications and alarms.

Such a configuration enables abnormality detection for the electric motor 3 which is driven by the power conversion device 6 and in which the current value and the driving frequency are changed, as in embodiment 1. Further, in the present embodiment, data read by the power conversion device 400 provided for each electric motor 3 is acquired by the communication unit 215 of the abnormality diagnosis device 200 so as to be subjected to processing, and the diagnosis result is transmitted to the monitoring device 300 and the power conversion device 400. Owing to this configuration, even at a large-scale factory in which a plurality of electric motors 3 and a plurality of mechanical apparatuses 4 are operated, the observer can come to the apparatus site on the basis of the contents displayed on the monitoring device 300, thereby observing the electric motors 3 and the mechanical apparatuses 4. In addition, since each power conversion device 400 is provided with the display unit 413 and the alarm unit 414 for indicating the diagnosis result, it is possible to easily specify the electric motor 3 that is diagnosed to have abnormality.

Here, the current detection unit 401 does not necessarily have to be provided in the power conversion device 400, and an external sensor may be used therefor. In the example shown in FIG. 15, two power conversion devices 400 are provided. However, the number of the power conversion devices 400 may be increased to three, four, etc., in accordance with the number of electric motors 3 and the number of mechanical apparatuses 4, and each power conversion device 400 may transmit the acquired data to the abnormality diagnosis device 200. In addition, each power conversion device 400 may be further provided with a storage unit 412, and after the acquired data is stored in the storage unit 412 during a certain period, the data may be collectively transmitted to the abnormality diagnosis device 200.

It is preferable that a failure DB 600 in which the past failure information is accumulated is connected to the abnormality diagnosis system 500. New failure information about diagnosis indicating abnormality is to be registered in the failure DB 600. The failure information is, for example, the current waveform detected when failure has occurred. The threshold for the spectrum intensity of sideband waves serving as an abnormality diagnosis criterion may be determined on the basis of a result of frequency analysis for the current waveform when failure has occurred. Thus, the abnormality diagnosis criterion can be clarified, whereby abnormality detection accuracy can be improved.

In embodiments 1 to 3, the case where the abnormality diagnosis device 10 and the abnormality diagnosis device 200 are provided separately from the power conversion device 6 and the power conversion device 400 that drive the electric motors 3, has been shown. However, the power conversion device 6 or the power conversion device 400 may be provided with a microcomputer in which a program having a function equivalent to the abnormality diagnosis device 10 or the abnormality diagnosis device 200 is incorporated. Such a configuration in which the abnormality diagnosis device 10 or the abnormality diagnosis device 200 is provided in the power conversion device 6 or the power conversion device 400 that drives the electric motor 3 makes it possible to perform abnormality diagnosis without constraints of the installation place due to increase in the number of wires.

DESCRIPTION OF THE REFERENCE CHARACTERS 1 power supply line
2 wiring circuit breaker
3 electric motor
4 mechanical apparatus
5 current detection unit
6 power conversion device
7 driving frequency detection unit
10 abnormality diagnosis device
11 processing unit
12 storage unit
13 display unit
14 alarm unit
15 communication unit
100 data acquisition unit
101 current waveform acquisition unit
102 current value acquisition unit
103 driving frequency acquisition unit
110 operation pattern storage unit
120 data determination unit
130 threshold storage unit
140 setting information storage unit
150 analysis unit
160 analysis result storage unit
170 abnormality diagnosis unit
141 rating information storage unit
142 frequency storage unit
143 load information storage unit
151 current frequency analysis unit
152 current spectrum averaging unit
153 sideband wave extraction unit
154 spectrum intensity calculation unit
1501 dq-axis coordinate conversion unit
1502 dq-axis current frequency analysis unit
1503 dq-axis current spectrum averaging unit
1504 dq-axis sideband wave extraction unit
1505 dq-axis spectrum intensity calculation unit
200 abnormality diagnosis device
300 monitoring device
400 power conversion device
500 abnormality diagnosis system

The invention claimed is:

1. An abnormality diagnosis device for diagnosing an abnormality in an electric motor, the abnormality diagnosis device comprising:
a data acquisition circuit to acquire a current waveform and a driving frequency of the electric motor driven by a power conversion device;
an operation pattern storage which stores a combination of an effective value of the current waveform and the driving frequency that are acquired at an identical time by the data acquisition circuit, the effective value of the current waveform being a square root of a value obtained by averaging a square of an instantaneous value of the current waveform over one cycle of the current waveform;
a data determination circuit to determine whether or not an effective value of the current waveform and the driving frequency as a diagnosis target that are acquired at an identical time by the data acquisition circuit match the combination of the effective value of the current waveform and the driving frequency stored in the operation pattern storage;
an analyzer circuit to perform frequency analysis for the current waveform determined to be matched by the data determination circuit, to extract sideband waves, and calculate a spectrum intensity of the sideband waves;
an abnormality diagnosis circuit to make a diagnosis that abnormality has occurred in the electric motor, when the spectrum intensity of the sideband waves is equal to or greater than a threshold;
a learning table configured to store a plurality of learning combinations, each of the plurality of learning combinations includes the effective value of the current waveform and the driving frequency that are acquired at the identical time, the identical time being different for each of the plurality of learning combinations;
the learning table is further configured to store for each of the plurality of learning combinations, a number of times an identical learning combination having a same effective value of the current waveform and a same driving frequency is acquired; and
the operation pattern storage stores one of the learning combinations as the combination of the effective value of the current waveform and the driving frequency that are acquired at the identical time only when the number of times of the learning combination is equal to or greater than a predetermined setting value.

2. The abnormality diagnosis device according to claim 1, wherein
the operation pattern storage stores a combination of the effective value of the current waveform and the driving frequency that are acquired at the identical time for a predetermined number of times or more by the data acquisition circuit.

3. The abnormality diagnosis device according to claim 1, wherein
the analyzer circuit extracts the sideband waves arising at positions separated by at least one of a rotation frequency and a bearing natural frequency from the driving frequency as a center.

4. The abnormality diagnosis device according to claim 1, wherein
the analyzer circuit converts the current waveform to d-axis current or q-axis current.

5. An abnormality diagnosis method for diagnosing an abnormality in an electric motor, the method comprising:
acquiring data of a current waveform and a driving frequency of the electric motor driven by a power conversion device;
storing a combination of an effective value of the current waveform and the driving frequency that are acquired at an identical time in the data acquisition, the effective value of the current waveform being a square root of a value obtained by averaging a square of an instantaneous value of the current waveform over one cycle of the current waveform;
determining whether or not an effective value of the current waveform and the driving frequency as a diagnosis target that are acquired at an identical time in the data acquisition match the combination of the effective value of the current waveform and the driving frequency stored in the storing step;

performing frequency analysis for the current waveform determined to be matched in the data determination, to extract sideband waves, and calculate a spectrum intensity of the sideband waves;

making a diagnosis that abnormality has occurred in the electric motor, when the spectrum intensity of the sideband waves is equal to or greater than a threshold;

storing a plurality of learning combinations, each of the plurality of learning combinations includes the effective value of the current waveform and the driving frequency that are acquired at the identical time, the identical time being different for each of the plurality of learning combinations, storing for each of the plurality of learning combinations, a number of times an identical learning combination having a same effective value of the current waveform, and a same driving frequency is acquired; and storing one of the learning combinations as the combination of the effective value of the current waveform and the driving frequency that are acquired at the identical time only when the number of times of the learning combination is equal to or greater than a predetermined setting value.

6. An abnormality diagnosis system for diagnosing an abnormality in the electric motor, the system comprising:
the power conversion device configured to acquire and transmit the current waveform and the driving frequency of the electric motor;
the abnormality diagnosis device according to claim 1, further configured to acquire the current waveform and the driving frequency transmitted by the power conversion device; and
a monitoring device configured to output at least one of an indication and an alarm on the basis of a result of diagnosis by the abnormality diagnosis device.

7. The abnormality diagnosis system according to claim 6, wherein
the power conversion device acquires the current waveform from a current sensor provided in the power conversion device.

8. The abnormality diagnosis device according to claim 2, wherein
the analyzer circuit extracts the sideband waves arising at positions separated by at least one of a rotation frequency and a bearing natural frequency from the driving frequency as a center.

9. The abnormality diagnosis device according to claim 2, wherein
the analyzer circuit converts the current waveform to d-axis current or q-axis current.

10. The abnormality diagnosis device according to claim 3, wherein
the analyzer circuit converts the current waveform to d-axis current or q-axis current.

11. An abnormality diagnosis system for diagnosing an abnormality in an electric motor, the system comprising:
a power conversion device configured to acquire and transmit a current waveform and a driving frequency of the electric motor driven by the power conversion device;
an abnormality diagnosis device that includes
a data acquisition circuit to acquire the current waveform and the driving frequency of the electric motor,
an operation pattern storage which stores a combination of an effective value of the current waveform and the driving frequency that are acquired at an identical first time by the data acquisition circuit, the effective value of the current waveform being a square root of a value obtained by averaging a square of an instantaneous value of the current waveform over one cycle of the current waveform,
a data determination circuit to determine whether or not an effective value of the current waveform and the driving frequency as a diagnosis target that are acquired at an identical second time by the data acquisition circuit match the combination of the effective value of the current waveform and the driving frequency stored in the operation pattern storage,
an analyzer circuit to perform frequency analysis for the current waveform determined to be matched by the data determination circuit, to extract sideband waves, and calculate a spectrum intensity of the sideband waves,
an abnormality diagnosis circuit to make a diagnosis that abnormality has occurred in the electric motor, when the spectrum intensity of the sideband waves is equal to or greater than a threshold,
a learning table configured to store a plurality of learning combinations, each of the plurality of learning combinations includes the effective value of the current waveform and the driving frequency that are acquired at the identical time, the identical time being different for each of the plurality of learning combinations,
the learning table is further configured to store for each of the plurality of learning combinations, a number of times an identical learning combination having a same effective value of the current waveform and a same driving frequency is acquired, and
the operation pattern storage stores one of the learning combinations as the combination of the effective value of the current waveform and the driving frequency that are acquired at the identical time only when the number of times of the learning combination is equal to or greater than a predetermined setting value, wherein
the operation pattern storage stores a combination of the effective value of the current waveform and the driving frequency that are acquired at a predetermined number of identical times by the data acquisition circuit,
the abnormality diagnosis device further configured to acquire the current waveform and the driving frequency acquired by the power conversion device; and
the system further comprising a monitoring device configured to output at least one of an indication and an alarm on the basis of a result of diagnosis by the abnormality diagnosis device.

12. The abnormality diagnosis system according to claim 11, wherein
the power conversion device acquires the current waveform from a current sensor provided in the power conversion device.

13. An abnormality diagnosis system for diagnosing an abnormality in an electric motor, the system comprising:
a power conversion device configured to acquire and transmit a current waveform and a driving frequency of the electric motor;
an abnormality diagnosis device that includes
a data acquisition circuit to acquire the current waveform and the driving frequency of the electric motor,
an operation pattern storage which stores a combination of an effective value of the current waveform and the driving frequency that are acquired at an identical first time by the data acquisition circuit, the effective value of the current waveform being a square root of a value obtained by averaging a square of an instantaneous value of the current waveform over one cycle of the current waveform, a data determination circuit to determine whether or not an effective value of the current waveform and the driving frequency as a diagnosis target that are acquired at an identical second time by the data acquisition circuit match the combination of the effective value of the current waveform and the driving frequency stored in the operation pattern storage, an analyzer circuit to perform frequency analysis for the current waveform determined to be matched by the data determination circuit, to extract sideband waves, and calculate a spectrum intensity of the sideband waves, and an abnormality diagnosis circuit to make a diagnosis that abnormality has occurred in the electric motor, when the spectrum intensity of the sideband waves is equal to or greater than a threshold, a learning table configured to store a plurality of learning combinations, each of the plurality of learning combinations includes the effective Value of the current waveform and the driving frequency that are acquired at the identical time, the identical time being different for each of the plurality of learning combinations, the learning table is further configured to store for each of the plurality of learning combinations, a number of times an identical learning combination having a same effective value of the current waveform and a same driving frequency is acquired, and the operation pattern storage stores one of the learning combinations as the combination of the effective value of the current waveform and the driving frequency that are acquired at the identical time only when the number of times of the learning combination is equal to or greater than a predetermined setting value, wherein the analyzer circuit extracts the sideband waves arising at positions separated by at least one of a rotation frequency and a bearing natural frequency from the driving frequency as a center, the abnormality diagnosis device further configured to acquire the current waveform and the driving frequency transmitted by the power conversion device; and the system further comprising a monitoring device configured to output at least one of an indication and an alarm on the basis of a result of diagnosis by the abnormality diagnosis device.

14. The abnormality diagnosis system according to claim 13, wherein
the power conversion device acquires the current waveform from a current sensor provided in the power conversion device.

15. An abnormality diagnosis system for diagnosing an abnormality in an electric motor, the system comprising:
a power conversion device configured to acquire and transmit a current waveform and a driving frequency of the electric motor driven by the power conversion device;

an abnormality diagnosis device that includes
a data acquisition circuit to acquire the current waveform and the driving frequency of the electric motor, transmitted by the power conversion device, an operation pattern storage which stores a combination of an effective value of the current waveform and the driving frequency that are acquired at an identical first time by the data acquisition circuit, the effective value of the current waveform being a square root of a value obtained by averaging a square of an instantaneous value of the current waveform over one cycle of the current waveform, a data determination circuit to determine whether or not an effective value of the current waveform and the driving frequency as a diagnosis target that are acquired at an identical second time by the data acquisition circuit match, the combination of the effective value of the current waveform and the driving frequency stored in the operation pattern storage, an analyzer circuit to perform frequency analysis for the current waveform determined to be matched by the data determination circuit, to extract sideband waves, and calculate a spectrum intensity of the sideband waves, and an abnormality diagnosis circuit to make a diagnosis that abnormality has occurred in the electric motor, when the spectrum intensity of the sideband waves is equal to or greater than a threshold, a learning table configured to store a plurality of learning combinations, each of the plurality of learning combinations includes the effective value of the current waveform and the driving frequency that are acquired at the identical time, the identical time being different for each of the plurality of learning combinations, the learning table is further configured to store for each of the plurality of learning combinations, a number of times an identical learning combination having a same effective value of the current waveform and a same driving frequency is acquired, and the operation pattern storage stores one of the learning combinations as the combination of the effective value of the current waveform and the driving frequency that are acquired at the identical time only when the number of times of the learning combination is equal to or greater than a predetermined setting value, wherein the analyzer circuit converts the current waveform to d-axis current or q-axis current, the abnormality diagnosis device further configured to acquire the current waveform and the driving frequency transmitted by the power conversion device; and the system further comprising a monitoring device configured to output at least one of an indication and an alarm on the basis of a result of diagnosis by the abnormality diagnosis device.

16. The abnormality diagnosis system according to claim 15, wherein
the power conversion device acquires the current waveform from a current sensor provided in the power conversion device.

17. The abnormality diagnosis device according to claim 1, wherein the power conversion device causes at least one of the current waveform and the driving frequency to change.

18. The abnormality diagnosis device according to claim 1, wherein the power conversion device causes the spectrum intensity of the sideband waves to change.

* * * * *